(12) United States Patent
Venkataraman (10) Patent No.: US 6,783,900 B2
(45) Date of Patent: Aug. 31, 2004

(54) COLOR FILTER IMAGING ARRAY AND METHOD OF FORMATION

(75) Inventor: Kartik Venkataraman, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 10/142,961

(22) Filed: May 13, 2002

(65) Prior Publication Data

US 2003/0211405 A1 Nov. 13, 2003

(51) Int. Cl.⁷ .................................................. G02B 5/20
(52) U.S. Cl. .............................. 430/7; 348/71; 348/77; 348/280; 257/440; 600/109; 359/891
(58) Field of Search ................................. 348/273, 275, 348/280, 65, 71, 77; 349/109; 257/440; 600/109; 359/891; 430/7

(56) References Cited

U.S. PATENT DOCUMENTS

| | | | | |
|---|---|---|---|---|
| 3,971,065 A | * | 7/1976 | Bayer | 348/276 |
| 4,565,756 A | * | 1/1986 | Needs et al. | 430/7 |
| 4,685,451 A | | 8/1987 | Ando | |
| 4,922,333 A | | 5/1990 | Nutting et al. | |
| 5,604,530 A | * | 2/1997 | Saito et al. | 348/70 |
| 6,137,100 A | * | 10/2000 | Fossum et al. | 250/208.1 |
| 6,292,212 B1 | | 9/2001 | Zigadlo et al. | |
| 2002/0167465 A1 | * | 11/2002 | Okuno et al. | 345/55 |

FOREIGN PATENT DOCUMENTS

| | | |
|---|---|---|
| DE | 100 46 309 | 10/2001 |
| EP | 0 667 115 | 8/1995 |

* cited by examiner

*Primary Examiner*—John A. McPherson
(74) *Attorney, Agent, or Firm*—Dickstein Shapiro Morin & Oshinsky LLP (57) ABSTRACT

A color filter array pattern for use in a solid-state imager comprising red sensitive elements located at every other array position, with alternating blue sensitive and green sensitive elements located at the remaining array positions, is disclosed. Since red color is sampled most frequently, the color filter may be part of an in vivo camera system for imaging internal human body organs and tissues.

51 Claims, 7 Drawing Sheets

FIG. 1
PRIOR ART

| R | G | R | G | R | G | R | G |
|---|---|---|---|---|---|---|---|
| B | R | B | R | B | R | B | R |
| R | G | R | G | R | G | R | G |
| B | R | B | R | B | R | B | R |
| R | G | R | G | R | G | R | G |
| B | R | B | R | B | R | B | R |
| R | G | R | G | R | G | R | G |
| B | R | B | R | B | R | B | R |

COLOR FILTER IMAGING ARRAY AND METHOD OF FORMATION

FIELD OF THE INVENTION

The present invention relates to color filters for use in a solid-state image sensor and, in particular, to a color filter array with a pattern that samples red color most frequently relative to blue and green colors, and method of formation.

BACKGROUND OF THE INVENTION

Solid-state image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plan arrays, and CMOS imagers. Current applications of solid-state imagers include cameras, scanners, machine vision systems, vehicle navigation systems, video telephones, computer input devices, surveillance systems, auto focus systems, star trackers, motion detector systems, image stabilization systems and data compression systems for high-definition television, among other uses.

These imagers typically consist of an array of pixel cells containing photosensors, where each pixel produces a signal corresponding to the intensity of light impinging on that element when an image is focused on the array. These signals may then be stored, for example, to display a corresponding image on a monitor or otherwise used to provide information about the optical image. The photosensors are typically phototransistors, photoconductors or photodiodes. The magnitude of the signal produced by each pixel, therefore, is proportional to the amount of light impinging on the photosensor.

To allow the photosensors to capture a color image, the photosensors must be able to separately detect red (R) photons, green (G) photons and blue (B) photons. Accordingly, each pixel must be sensitive only to one color or spectral band. For this, a color filter array (CFA) is typically placed in front of the pixels so that each pixel measures the light of the color of its associated filter. Thus, each pixel of a color image sensor is covered with either a red, green or blue filter, according to a specific pattern.

Figure 1:
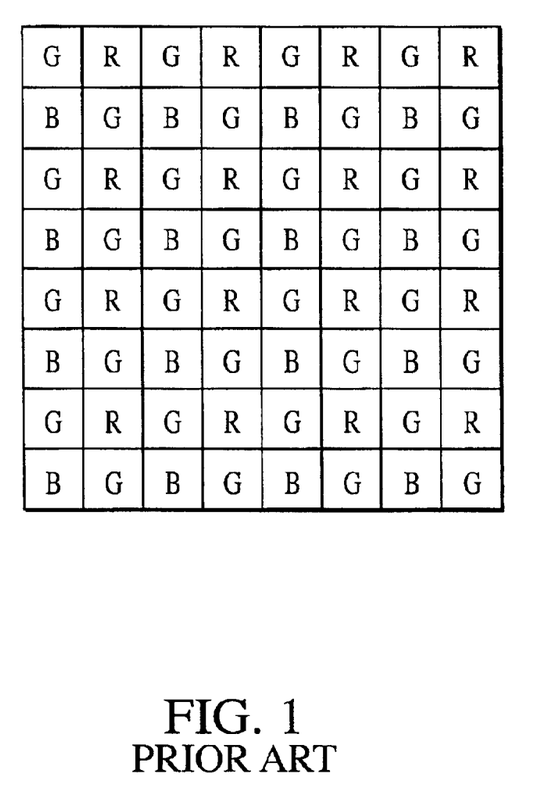
FIG. 1 illustrates a schematic representation of the Bayer color pattern.

FIG. 1 illustrates one such color filter array pattern, known as the "Bayer" pattern, which is described in more detail in U.S. Pat. No. 3,971,065 (the disclosure of which is incorporated by reference herein). In the Bayer pattern, red, green and blue pixels are arranged so that alternating pixels of red and green are on a first row of an image, and alternating pixels of blue and green are on a next row. Thus, when the image sensor is read out, line by line, the pixel sequence for the first line reads GRGRGR etc., and then the alternate line sequence reads BGBGBG etc. This output is called sequential RGB or sRGB.

In the Bayer pattern, sampling rates for all three basic color vectors are adjusted according to the acuity of the human visual system. That is, green color, to which the human eye is most sensitive and responsive, is sampled most frequently, whereas blue color, for which the human vision has least resolution, is sampled the least frequently. This is why in the Bayer pattern, the green-sensitive elements, which serve to detect luminance (the color vector which provides the luminance information) occur at every other array position, while the red-sensitive elements alternate with the blue-sensitive elements.

As a result of these attributes, the Bayer pattern has vast applications in imaging objects having a more or less uniform representations of colors across the entire visible spectrum. Thus, sampling the green color at twice the frequency of the other primary colors provides a good representation of the luminance component of a particular object being imaged. Nevertheless, if the object being imaged has a relatively low spectral reflectivity in the green part of the wavelength, the image captured with an imager employing a Bayer color filter pattern can be suboptimal.

There is needed, therefore, a color filter array pattern of a CMOS-sensor for sensing objects which do not have a uniform representation of colors across the visible spectrum, for example, elements of the human body non-visible to the naked eye, such as the internal organs of the gastrointestinal tract. A method of fabricating such color filter pattern is also needed.

BRIEF SUMMARY OF THE INVENTION

In one aspect, the present invention provides a color filter array pattern for use in a solid-state imager for imaging internal organs comprising red sensitive elements located at every other array position, and alternating blue sensitive and green sensitive elements located at the remaining array positions. This way, red color is sampled most frequently and blue and green colors are sampled least frequently.

In another aspect, the invention provides a method of using a color filter array pattern of a solid-state imager for imaging objects which do not have a uniform representation of colors across the visible spectrum, for example, internal organs of the human gastrointestinal tract. By employing the color filter pattern of the present invention in in vivo video camera systems or in a small CCD or CMOS imager capsule camera used in medical procedures, such as gastrointestinal endoscopy for example, the predominantly red color of the organs of human gastrointestinal tract is sampled at twice the frequency of the other two basic colors, blue and green.

Also provided are methods for forming the color filter array pattern of the present invention. These and other advantages and features of the present invention will be apparent from the following detailed description and drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or above the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative CMOS imager pixel is illustrated in the figures and description herein. However, this is just one example of the type of imagers and pixel cells thereof with which the invention may be used. The following detailed description is, therefore, not to be taken in a limiting sense, but rather as an exemplary illustration of the invention.

Figure 2:
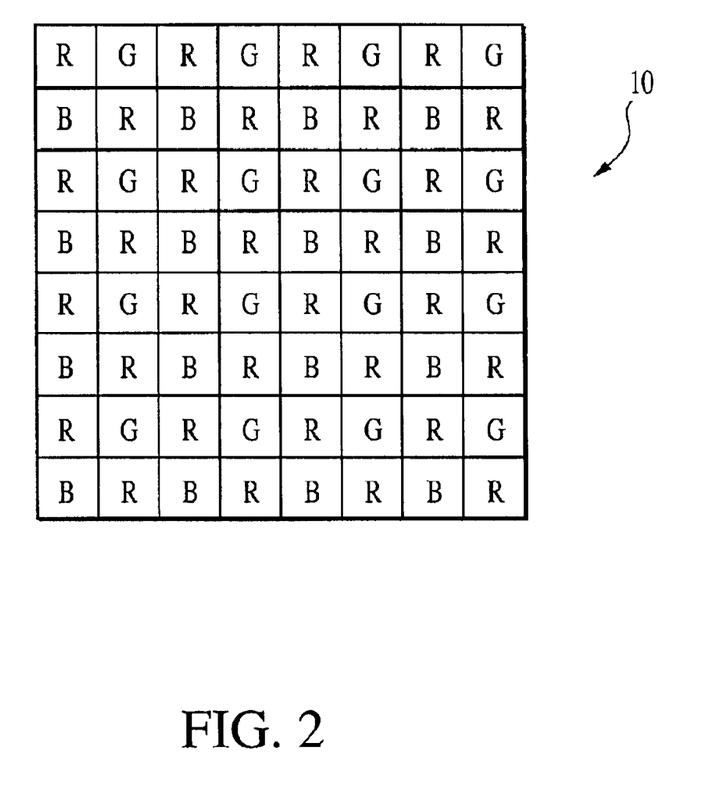
FIG. 2 illustrates a schematic representation of a color filter pattern of the present invention.
Figure 3:
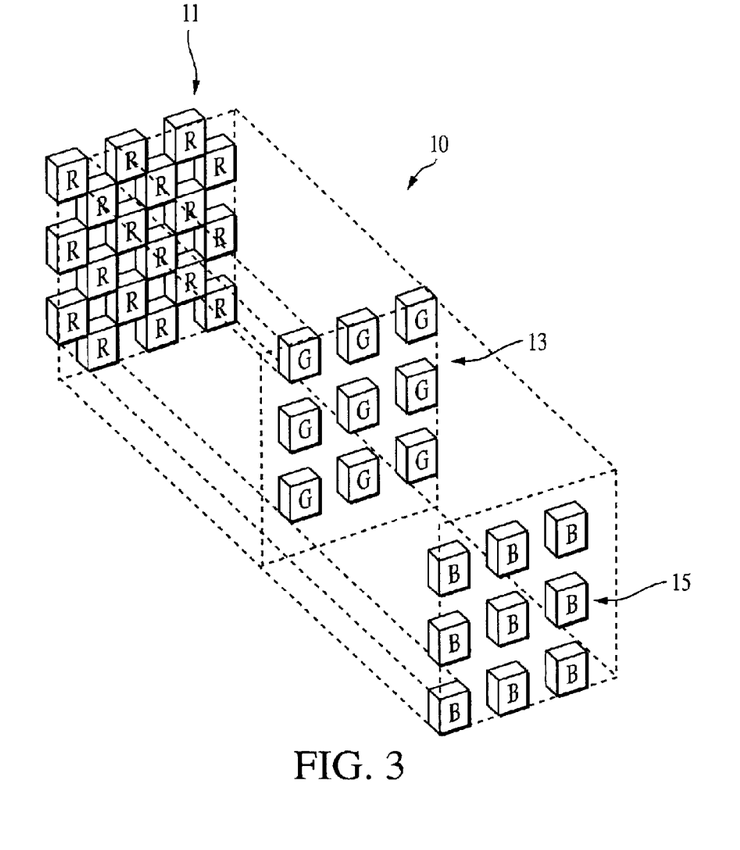
FIG. 3 is an exploded three-dimensional representation of the color filter pattern of FIG. 2.

Referring now to the drawings, where like elements are designated by like reference numerals, an image sampling array pattern (color filter pattern) 10 of the present invention is illustrated in FIGS. 2–3. Three sets of sensor patterns 11, 13 and 15 (FIG. 3), each corresponding to a basic color vector, are interlaid to form the image sampling array pattern 10 (FIGS. 2–3). The sensor pattern 11 is formed of red-sensitive elements (also called luminance elements) which are denoted by an "R" and are arranged at every other element position of the sampling array. Since the sensor pattern 11 has the highest number of color sensitive elements, the sensor pattern 11 is called the luminance pattern. As illustrated in FIGS. 2–3, the red luminance elements of sensor pattern 11 occur at half the element positions of the array and are uniformly distributed over the entire sampling array 10. Thus, luminance detail is sampled by the red elements which form the largest population of elements.

Sensor pattern 13 has green elements denoted "G" which alternate with the red luminance elements of the sensor pattern 11 in alternate rows. Similarly, sensor pattern 15 has blue elements denoted "B" which alternate with the red luminance elements of the sensor pattern 11 in alternate rows. This way, sensor patterns 13 and 15 form a symmetrical and uniform arrangement in two orthogonal positions, horizontal and vertical, as shown in FIG. 2. When an image sensor is read out, line by line, the pixel sequence reads RGRGRG etc., and then the alternate line sequence reads BRBRBR etc.

In the arrangement of FIGS. 2–3, the red elements form half of the element population, while the blue and green elements form the other half of the element population. Thus, the blue sensitive elements form one fourth of the element population, while the green sensitive elements also form one fourth of the element population. As a result of the twice greater population of the red elements relative to the blue and green ones, red detail is sampled at a twice higher rate than blue detail or green detail. As a result of the red luminance pattern, sampling of an image devoid of all three basic colors, for example, of an image predominant in red and red hues, is symmetrical and uniform in both the horizontal and vertical direction. Thus, the color sampling array pattern 10 is preferably employed for sampling all three basic color vectors according to the primary color of the internal human body, that tends to be in the red spectrum. Sampling the red color at twice the frequency of the other two primary colors provides a good representation of the luminance component of a particular internal body part, organ, tissue or element being imaged.

Figure 4:
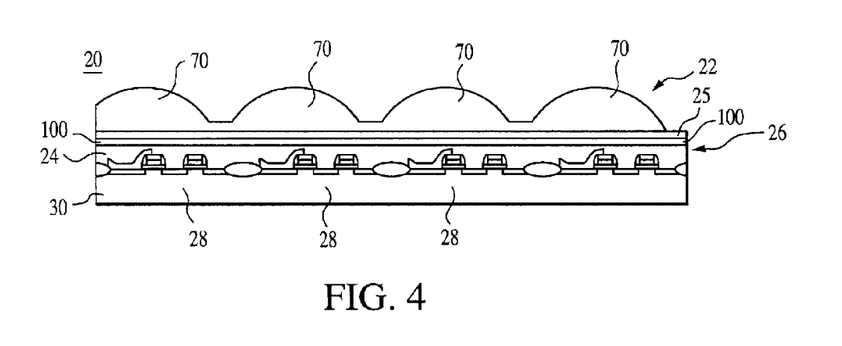
FIG. 4 is a side cross-sectional view illustrating the principal elements of a solid-state imager having a color filter array constructed in accordance with the present invention.
Figure 5:
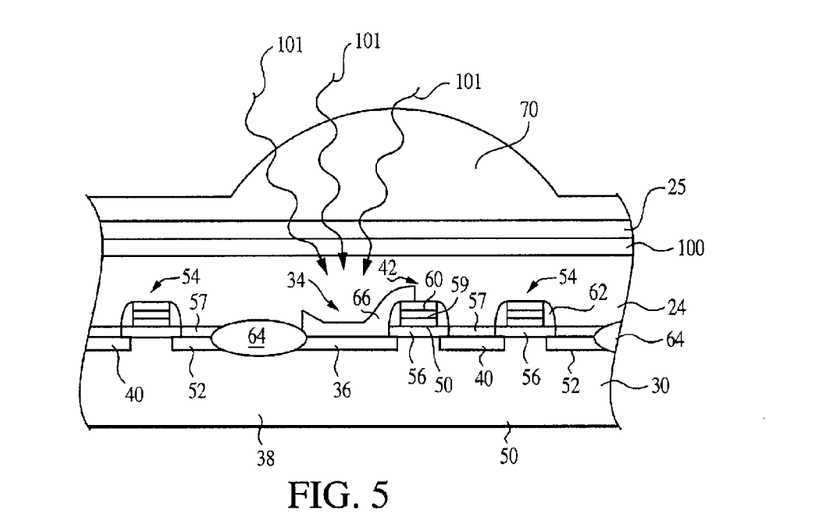
FIG. 5 illustrates a schematic cross-sectional view of a CMOS imager pixel cell having a color filter array constructed in accordance with the present invention.
Figure 6:
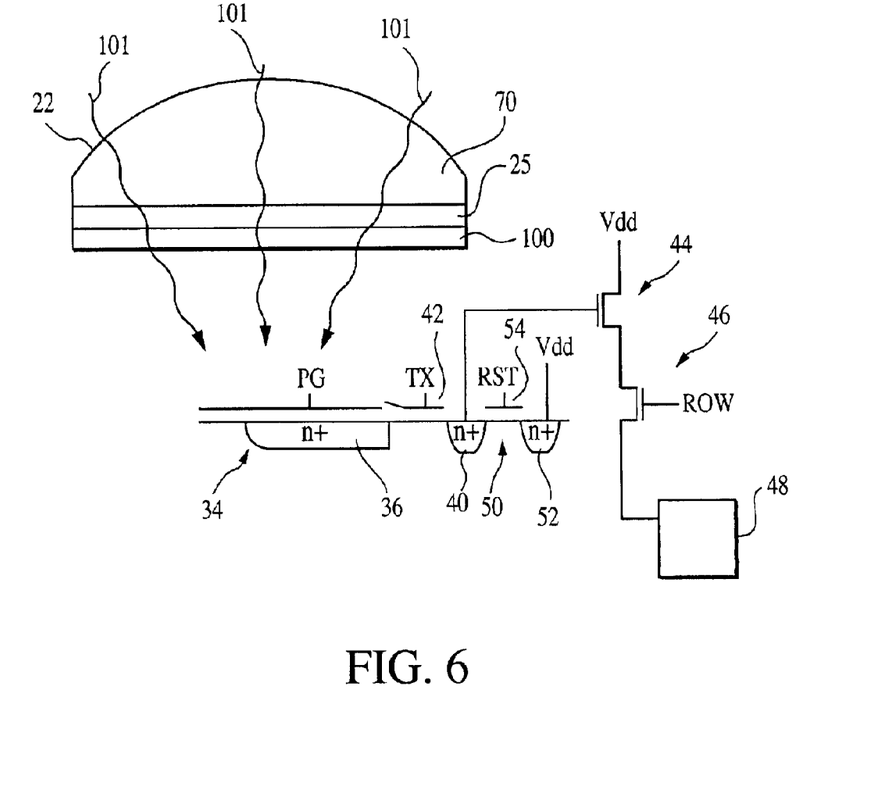
FIG. 6 is a representative diagram of the CMOS imager pixel cell of FIG. 5.

A solid-state imager 20 comprising a color filter layer 100 having color filter pattern 10 of the present invention is schematically illustrated in FIGS. 4–6. The imager 20 comprises color filter layer 100 formed over a pixel array 26 as part of the same substrate 30, which may be any of the types of substrate described above. The pixel array 26 comprises a plurality of pixel sensor cells 28 formed in and over the substrate, and is covered by a protective layer 24 that acts as a passivation and planarization layer for the imager 20. Protective layer 24 may be a layer of BPSG, PSG, BSG, silicon dioxide, silicon nitride, polyimide, or other well-known light transmissive insulator.

The color filter layer 100 having color filter pattern 10 described above is formed over the passivation layer 24. The color filter layer 100 comprises an array of red sensitive elements located at every other array position, and alternating blue sensitive and green sensitive elements located at the remaining array positions, as described in detail above with reference to the color imaging array pattern 10. This way, the color filter layer 100 samples red color most frequently and blue and green colors least frequently.

As also depicted in FIGS. 4–6, a microlens array 22 is formed so that microlens 70 are formed above each pixel cell 28. The microlens array 22 is formed such that the focal point of the array is centered over the photosensitive elements in each pixel cell 28. The device also includes a spacer layer 25 under the mircolens array 22 and over the color filter layer 100. The thickness of spacer layer 25 is adjusted such that the photosensitive element is at a focal point for the light traveling through lenses 70 of microlens array 22.

As shown in FIGS. 5–6, each pixel sensor cell 28 contains a photosensor 34, which may be a photodiode, photogate, or the like. A photogate photosensor 34 is depicted in FIGS. 5–6. An applied control signal PG is applied to the photogate 34 so that when incident radiation 101 in the form of photons passes color filter layer 100 and strikes the photosensor 34, the photo-generated electrons accumulate in the doped region 36 under the photosensor 34. A transfer transistor 38 is located next to the photosensor 34, and has source and drain regions 36, 40 and a gate stack 42 controlled by a transfer signal TX. The drain region 40 is also called a floating diffusion region or a floating diffusion node, and it passes charge received from the photosensor 34 to output transistors 44, 46 and then to readout circuitry 48. A reset transistor 50 comprised of doped regions 40, 52 and gate stack 54 is controlled by a reset signal RST which operates to reset the floating diffusion region 40 to a predetermined initial voltage just prior to signal readout. Details of the formation and function of the above-described elements of a pixel sensor cell may be found, for example, in U.S. Pat. No. 6,376,868 and U.S. Pat. No. 6,333,205, the disclosures of which are incorporated by reference herein.

As illustrated in FIG. 5, the gate stacks 42, 54 of the pixel cell 28 for the transfer 38 and reset 50 transistors include a silicon dioxide or silicon nitride insulator 56 on the substrate 30, which in this example is a p-type substrate, a conductive layer 58 of doped polysilicon, tungsten, or other suitable material over the insulating layer 56, and an insulating cap layer 60 of, for example, silicon dioxide, silicon nitride, or ONO (oxide-nitride-oxide). A silicide layer 59 may be used between the polysilicon layer 58 and the cap 60, if desired. Insulating sidewalls 62 are also formed on the sides of the gate stacks 42, 54. These sidewalls may be formed of, for example, silicon dioxide, silicon nitride, or ONO. A field oxide layer 64 around the pixel cell 28 serves to isolate it from other pixel cells in the array. A second gate oxide layer 57 may be grown on the silicon substrate and the photogate semi-transparent conductor 66 is patterned from this layer. In the case that the photosensor is a photodiode, no second gate oxide layer 57 and no photogate semi-transparent conductor 66 is required. Furthermore, transfer transistor 38 is optional, in which case the diffusion regions 36 and 40 are connected together.

Figure 7:
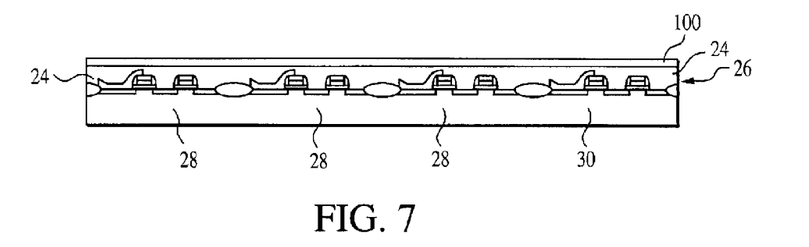
FIG. 7 illustrates a cross-sectional view of a semiconductor wafer undergoing the process of forming a color pattern layer according to an embodiment of the present invention.

The color filter layer 100 of the embodiment described above is manufactured through a process described as follows, and illustrated in FIGS. 7–9. Referring now to FIG. 7, a substrate 30, which may be any of the types of substrates described above, having a pixel array 26, peripheral circuits, contacts and wiring formed thereon by well-known methods, is provided. A protective layer 24 of BPSG, BSG, PSG, silicon dioxide, silicon nitride or the like is formed over the pixel array 26 to passivate it and to provide a planarized surface.

A color filter layer 100 is formed over the passivation layer 24, as also shown in FIG. 7. The color filter layer 100 may be formed of a color resist or acrylic material which is used as a light transmitting material. For example, color filter layer 100 may be formed of a plurality of color filter layers, each of the plurality of color filter layers consisting of red filter regions (not shown), green filter regions (not shown) and blue filter regions (not shown), which are formed, for example, from resist or acrylic material of the respective color-filtering qualities. As such, red sensitive resist material, blue sensitive resist material and green sensitive resist material may be employed to form the red, blue and green sensitive elements of each of the plurality of color filter layers that form color filter layer 100. These red, blue and green elements are disposed side by side, and according to the above-described color filter pattern 10, so that the red sensitive elements are located at every other array position, with alternating blue sensitive and green sensitive elements located at the remaining array positions. Other embodiments may employ other colored materials, such as paint or dye, as known in the art. The color filter layer 100 may be formed over the passivation layer 24 by conventional deposition or spin-on methods, for example.

The red, blue and green filter elements are preferably squares of generally less than 50 microns wide, although other geometrical shapes may be used also, and are placed in registration with the photosensitive elements (for example photodiodes) of the semiconductor layer.

Figure 8:
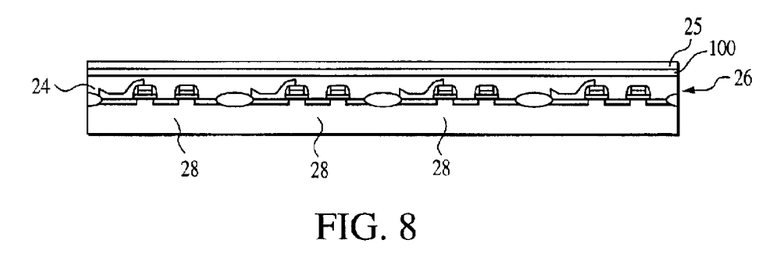
FIG. 8 illustrates the semiconductor wafer of FIG. 7 at a stage of processing subsequent to that shown in FIG. 7.
Figure 9:
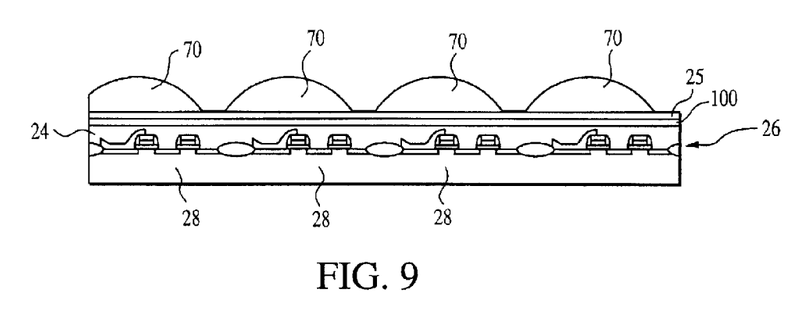
FIG. 9 illustrates the semiconductor wafer of FIG. 7 at a stage of processing subsequent to that shown in FIG. 8.

Next, a spacing layer 25 is formed over the protective layer 24, as illustrated in FIG. 8. Refractive lenses 70 may then be formed, as shown in FIG. 9, from a lens forming layer, for example, so that each lens 70 overlies a pixel cell 28. Alternative constructions in which a lens 70 overlies multiple pixel cells 28 are also encompassed by the present invention.

The color filter layer 100 is essentially complete at this stage, and conventional processing methods may now be performed to package the imager 20. Pixel arrays having the color filter array pattern of the present invention, and described with reference to FIGS. 2–9, may be further processed as known in the art to produce a CMOS imager.

Figure 10:
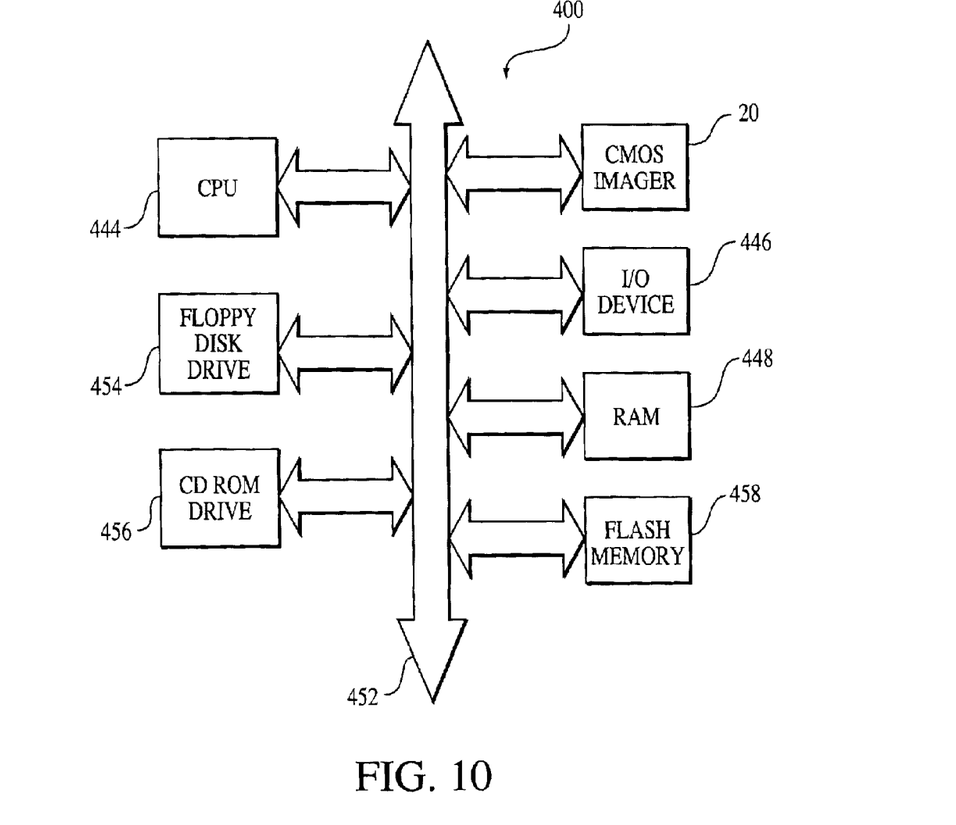
FIG. 10 is an illustration of an imaging system having an imager with a color filter pattern according to the present invention.

The filter array of the present invention may be also used with pixels of other types of imagers as well, for example, with a CCD imager. If desired, the imager 20 may be combined with a processor, such as a CPU, digital signal processor or microprocessor. The imager 20 and the microprocessor may be formed in a single integrated circuit. An exemplary processor system 400 using a CMOS imager having a filter array in accordance with the present invention is illustrated in FIG. 10. A processor based system is exemplary of a system having digital circuits which could include CMOS or other imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

As shown in FIG. 10, an exemplary processor system 400 generally comprises a central processing unit (CPU) 444, e.g., a microprocessor, that communicates with an input/output (I/O) device 446 over a bus 452. The imager 20 also communicates with the system over bus 452. The computer system 400 also includes random access memory (RAM) 448, and may include peripheral devices such as a floppy disk drive 454, a compact disk (CD) ROM drive 456 or a flash memory 458 which also communicate with CPU 444 over the bus 452. The floppy disk 454, the CD ROM 456 or flash memory 458 stores images captured by imager 20. The imager 20 is preferably constructed as an integrated circuit, with or without memory storage, which includes a color filter layer 100 having color filter pattern 10 of the present invention, as previously described with respect to FIGS. 2–9.

Since the color filter array pattern for use in a solid-state imager, as described above, comprises red sensitive elements located at every other array position, and alternating blue sensitive and green sensitive elements located at the remaining array positions, red color is sampled most frequently and blue and green color are sampled least frequently. For this reasons, the color filter array pattern of the present invention may be employed for obtaining images and data measurements from a variety of organ systems, tissues and cells for use in splanchnology (study of viscera), neurology (study of nervous system), osteology (study of bones), syndesmology (study of ligaments and joints) and myology (study of muscles), among others. This way, sampling red color (the primary color of internal body organs, tissues and cells) at twice the frequency of the other two primary colors provides a good representation of the luminance component of the particular internal body organ, tissue or cell being imaged.

Accordingly, and in a preferred embodiment of the present invention, the imager 20 is constructed as an integrated circuit with a color filter layer 100 and color filter pattern 10 of the present invention, and further as a part of an in vivo video camera system or an in vivo measurement system, which detects images and analyzes data of various systems of the human body, such as the digestive or muscular systems, for example. In vivo video camera and measurement systems typically include swallowable electronic capsules which collect data from various internal body organs or tissues and further transmit data to a receiver system. These swallowable intestinal capsules may also include a transmission system for transmitting the measured data at various radio frequencies to the receiver system.

Other in vivo detecting and measuring systems, to which the imager 20 comprising color filter layer 100 with color filter pattern 10 of the present invention may be attached, are endoscopes, which are typically long tubes that patients swallow to provide images of the upper or lower gastrointestinal tract. The endoscopes may be fiber optic endoscopes or video endoscopes. In video endoscopes, for example, a small electronic camera is placed at the area of interest and stores the images until after the test finishes.

More detail on in vivo video cameras and swallowable capsules are provided, for example, in U.S. Pat. No. 5,604,531 to Iddan et al.; U.S. Pat. No. 4,278,077 to Mizumoto; U.S. Pat. No. 5,267,033 to Hoshino; and E. N. Rowland and H. S. Wolff, *The Radio Pill: Telemetering from the Digestive Tract*, British Communications and Electronics (Aug. 1960, pp. 598–601), the disclosures of which are incorporated by reference herein.

It should again be noted that although the invention has been described with specific reference to imaging circuits having a pixel array, the invention has broader applicability and may be used in any imaging apparatus. Similarly, the process for the fabrication of the color filter layer 100 described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed is:

1. A color filter array for use in an imaging device comprising:
    an imaging array comprising a plurality of pixel cells containing photosensors; and
    an array of light sensitive elements provided over said photosensors, said array of light sensitive elements comprising red sensitive elements, said red sensitive elements occurring at every other element position of said array of light sensitive elements.

2. The color filter array of claim 1, wherein said array of light sensitive elements further comprises blue sensitive elements and green sensitive elements arranged in repeating patterns with respect to said red sensitive elements.

3. The color filter array of claim 1, wherein said blue sensitive elements and said green sensitive elements alternate with said red sensitive elements in alternate rows, respectively, of said array of light sensitive elements.

4. The color filter array of claim 3, wherein said blue sensitive elements occur at one fourth of said element positions.

5. The color filter array of claim 1, wherein said imaging device is part of an in vivo camera system.

6. The color filter array of claim 1, wherein said imaging device is part of an in vivo CMOS capsule camera.

7. The color filter array of claim 1, wherein said imaging device is part of an endoscope.

8. A color filter pattern for USC in an imaging device comprising:
    a plurality of light sensitive elements provided over a plurality of pixel cells comprising photosensors, said plurality of light sensitive elements comprising red sensitive elements, blue sensitive elements and green sensitive elements arranged in a predefined pattern, said red sensitive elements occurring at every other element position of said predefined pattern.

9. The color filter pattern of claim 8, wherein said blue sensitive elements and said green sensitive elements arranged in repeating order with respect to said red sensitive elements.

10. The color filter pattern of claim 9, wherein said blue sensitive elements and said green sensitive elements alternate with said red sensitive elements in alternate rows, respectively, of said predefined pattern.

11. The color filter pattern of claim 8, wherein said blue sensitive elements occur at one fourth of said element positions.

12. The color filter pattern of claim 8, wherein said imaging device is part of an in vivo camera system.

13. The color filter pattern of claim 8, wherein said imaging device is part of an in vivo CMOS capsule camera.

14. The color filter pattern of claim 8, wherein said imaging device is part of an endoscope.

15. A color filter pattern for use in a swallowable capsule imaging device comprising:
    a plurality of light sensitive elements provided over an imaging area of said swallowable capsule imaging device, said plurality of light sensitive elements comprising red sensitive elements, blue sensitive elements and green sensitive elements arranged in a predefined pattern, said red sensitive elements occurring at every other element position of said predefined pattern, and wherein said blue sensitive elements and said green sensitive elements alternate with said red sensitive elements in alternate rows, respectively, of said predefined pattern.

16. The color filter pattern of claim 15, wherein said blue sensitive elements occur at one fourth of said element positions.

17. The color filter pattern of claim 15, wherein said capsule imaging device is part of an in vivo camera system.

18. An imager comprising:
    an imaging array having a plurality of pixel sensor cells formed at an upper surface of a substrate and providing output data representing an image; and
    a color filter layer formed on said imaging array, said color filter layer comprising a plurality of red sensitive elements, blue sensitive elements and green sensitive elements, said plurality of red, blue and green sensitive elements being arranged in a color filter pattern so that said red sensitive elements occur at every other element position of said color filter pattern.

19. The imager of claim 18, wherein said blue sensitive elements and said green sensitive elements alternate with said red sensitive elements in alternate rows, respectively, of said color filter pattern.

20. The imager of claim 18, wherein said blue sensitive elements occur at one fourth of said element positions.

21. The imager of claim 18, wherein said pixel sensor cells are part of an in vivo camera system.

22. The imager of claim 18, wherein said pixel sensor cells are part of an in vivo CMOS capsule camera.

23. The imager of claim 18, wherein said pixel sensor cells are part of an endoscope.

24. The imager of claim 18, wherein said pixel sensor cells provide output data representing an image of an internal body organ.

25. The imager of claim 18, wherein said pixel sensor cells provide output data representing an image of an internal body muscle.

26. The imager of claim 18, wherein said pixel sensor cells provide output data representing an image of an internal body tissue.

27. A CMOS imager comprising:
   an array of pixel sensor cells formed at an upper surface of a substrate;
   a protective layer formed over said array; and
   a color filter layer formed on said protective layer, said color filter layer comprising a plurality of red sensitive elements, blue sensitive elements and green sensitive elements, said plurality of red, blue and green sensitive elements being arranged in a color filter pattern so that said red sensitive elements occur at every other element position of said color filter pattern.

28. The CMOS imager of claim 27, wherein said blue sensitive elements and said green sensitive elements alternate with said red sensitive elements in alternate rows, respectively, of said color filter pattern.

29. The CMOS imager of claim 27, wherein said blue sensitive elements occur at one fourth of said element positions.

30. The CMOS imager of claim 27, wherein said pixel sensor cells are part of an in vivo camera system.

31. The CMOS imager of claim 27, wherein said pixel sensor cells are part of an endoscope.

32. The CMOS imager of claim 27, wherein said pixel sensor cells provide output data representing an image of an internal body organ.

33. The CMOS imager of claim 27, wherein said pixel sensor cells provide output data representing an image of an internal body tissue.

34. A method of forming a color filter array for use in an imaging device, said method comprising the steps of:
   providing a substrate having an array of pixel sensors cells formed thereon;
   providing a protective layer over said pixel sensors cells; and
   forming a color filter layer over said protective layer, said color filter layer being formed of a plurality of light sensitive elements comprising red sensitive elements, blue sensitive elements and green sensitive elements, said plurality of light sensitive elements being arranged in a predefined pattern so that said red sensitive elements occur at every other element position of said predefined pattern.

35. The method of claim 34, wherein said blue sensitive elements and said green sensitive elements alternate with said red sensitive elements in alternate rows, respectively, of said color filter pattern.

36. The method of claim 35, wherein said blue sensitive elements occur at one fourth of said element positions.

37. The method of claim 34, wherein said pixel sensor cells form part of an in vivo camera system.

38. The method of claim 37, wherein said pixel sensor cells form part of an in vivo CCD capsule camera.

39. The method of claim 34, wherein said pixel sensor cells form part of an endoscope.

40. The method of claim 34, wherein said pixel sensor cells provide output data representing an image of an internal body organ.

41. The method of claim 40, wherein said pixel sensor cells provide output data representing an image of an internal body muscle.

42. The method of claim 34, wherein said pixel sensor cells provide output data representing an image of an internal body tissue.

43. The method of claim 34, wherein said pixel sensor cells provide output data representing an image of the human cardiovascular system.

44. A method of forming a color filter array for use in an in vivo video camera system, said method comprising the steps of:
   providing a semiconductor substrate having an array of pixel sensors cells formed thereon, said pixel sensor cells providing output data representing an image of internal human body;
   providing a protective layer over said pixel sensors cells; and
   forming a color filter layer over said protective layer, said color filter layer being formed of a plurality of light sensitive elements comprising red sensitive elements, blue sensitive elements and green sensitive elements, said plurality of light sensitive elements being arranged in a predefined pattern so that said red sensitive elements occur at every other element position of said predefined pattern.

45. The method of claim 44, wherein said blue sensitive elements and said green sensitive elements alternate with said red sensitive elements in alternate rows, respectively, of said color filter pattern.

46. The method of claim 45, wherein said blue sensitive elements occur at one fourth of said element positions.

47. The method of claim 44, wherein said in vivo video camera is a CMOS capsule camera.

48. The method of claim 44, wherein said in vivo video camera is part of an endoscope.

49. The method of claim 44, wherein said pixel sensor cells provide output data representing an image of an internal muscle.

50. The method of claim 44, wherein said pixel sensor cells provide output data representing an image of the cardiovascular system.

51. The method of claim 44, wherein said pixel sensor cells provide output data representing an image of the gastrointestinal system.

* * * * *